(12) United States Patent
Li et al.

(10) Patent No.: US 7,902,923 B2
(45) Date of Patent: Mar. 8, 2011

(54) COMMON-GATE COMMON-SOURCE AMPLIFIER

(75) Inventors: Xiaoyong Li, Santa Clara, CA (US); Rahul A. Apte, San Francisco, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 71 days.

(21) Appl. No.: 12/407,704

(22) Filed: Mar. 19, 2009

(65) Prior Publication Data

US 2010/0237942 A1   Sep. 23, 2010

(51) Int. Cl.
*H03F 3/68* (2006.01)
(52) U.S. Cl. ........................................ 330/295; 330/69
(58) Field of Classification Search .................. 330/295, 330/69, 252, 124 R
See application file for complete search history.

(56) References Cited

U.S. PATENT DOCUMENTS

| | | | |
|---|---|---|---|
| 5,101,126 A * | 3/1992 | Butler et al. ................. | 327/103 |
| 5,777,514 A | 7/1998 | Mittal et al. | |
| 6,437,607 B1 * | 8/2002 | Milanesi ........................ | 327/90 |
| 6,650,875 B1 | 11/2003 | Rozenblit et al. | |
| 6,806,744 B1 | 10/2004 | Bell et al. | |
| 6,859,089 B2 * | 2/2005 | Farley ........................... | 327/427 |
| 7,053,671 B1 | 5/2006 | Wong | |
| 7,120,427 B1 | 10/2006 | Adams et al. | |
| 2006/0046681 A1 | 3/2006 | Bagheri et al. | |
| 2006/0068749 A1 | 3/2006 | Ismail et al. | |

FOREIGN PATENT DOCUMENTS

| | | |
|---|---|---|
| EP | 1376861 A2 | 1/2004 |
| EP | 1909387 A1 | 4/2008 |
| WO | WO03021768 A1 | 3/2003 |

OTHER PUBLICATIONS

Azevedo F et al: "A 5GHz/1.8V CMOS active balun integrated with LNA" Microwave Conference, 2008. APMC 2008. Asia-Pacific, IEEE, Piscataway, NJ, USA, Dec. 16, 2008, pp. 1-4, XP031636891 ISBN: 978-1-4244-2641-6 figure 3.

Blaakmeer S C et al: "A wideband Noise-Canceling CMOS LNA exploiting a transformer" Radio Frequency Integrated Circuits (RFIC) Symposium, 2006 IEEE, IEEE, Piscataway, NJ, USA LNKDDOI: 10.1109/RFIC.2006.1651110, Jun. 11, 2006, pp. 137-140, XP010925159 ISBN: 978-0-7803-9572-5.

Dong-Gu Im et al: "A Wide-Band CMOS Variable-Gain Low Noise Amplifier for Multi-Standard Terrestrial and Cable TV Tuner" Radio Frequency Integrated Circuits (RFIC) Symposium, 2007 IEEE, IEEE, Piscataway, NJ, USA, Jun. 1, 2007, pp. 621-624, XP031113107 ISBN: 978-1-4244-0530-5 p. 622, right-hand column; figure 2.

International Search Report and Written Opinion - PCT/US2010/027855, International Search Authority - European Patent Office - Oct. 5, 2010..

(Continued)

*Primary Examiner* — Henry K Choe
(74) *Attorney, Agent, or Firm* — Ramin Mobarhan

(57) ABSTRACT

Techniques for integrating a common-source and common-gate amplifier topology in a single amplifier design. In one aspect, an input voltage is provided to both a common-source amplifier and a common-gate amplifier. The output voltages of the common-source amplifier and the common-gate amplifier are provided to a difference block for generating a single-ended voltage proportional to the difference between the output voltages. When applied to the design of, e.g., low-noise amplifiers (LNA's), the disclosed techniques may offer improved noise performance over the prior art.

23 Claims, 8 Drawing Sheets

OTHER PUBLICATIONS

Jussila J et al: "A 1.2-V Highly Linear Balanced Noise-Cancelling LNA in 0.13- CMOS" IEEE Journal of Solid-State Circuits, IEEE Service Center, Piscataway, NJ, US, vol. 43, No. 3, Mar. 1, 2008, pp. 579-587, XP011204865 ISSN: 0018-9200 p. 3, right-hand column, line 12 - p. 4, left-hand column, line 12; figure 4.

Kefeng Han et al: "A wideband CMOS variable gain low noise amplifier based on single-to-differential stage for TV tuner applications" Solid-State Circuits Conference, 2008. A-SSCC '08. IEEE Asian, IEEE, Piscataway, NJ, USA LNKDDOI: 10.1109/ASSCC.2008.4708826, Nov. 3, 2008, pp. 457-460, XP031373061 ISBN: 978-1-4244-2604-1 p. 457 - right-hand column; figures 2,3.

Stephan C. Blaakmeer et al., "Wideband Balun-LNA With Simultaneous Output Balancing, Noise-Canceling and Distortion-Canceling" IEEE Journal of Solid-State Circuits, IEEE Service Center, Piscataway, NJ, US, vol. 43, No. 6, Jun. 1, 2008, pp. 1341-1350, XP011215762 ISSN: 0018-9200.

Stephan C Blaakmeer et al: "The Blixer, a Wideband Balun-LNA-I/Q-Mixer Topology" IEEE Journal of Solid-State Circuits, IEEE Service Center, Piscataway, NJ, US LNKDD01: 10.1109/JSSC.2008.2004866, vol. 43, No. 12, Dec. 1, 2008, pp. 2706-2715, XP011238672 ISSN: 0018-9200 the whole document.

Thu T N T et al: "Reciprocal noise canceling low power UWB LNA" Soc Design Conference (ISOCC), 2009 International, IEEE, Piscataway, NJ, USA, Nov. 22, 2009, pp. 13-16, XP031644226 ISBN: 978-1-4244-5034-3.

Zhiqun Li et al: "40-Gb/s, 0.18-1 1/4 m CMOS Front-End Amplifier for VSR Parallel Optical Receiver" Photonics and Optoelectronics, 2009. S0P0 2009. Symposium on, IEEE Express Conference Publishing, Piscataway, NJ, USA, Aug. 14, 2009, pp. 1-4, XP031524445 ISBN: 978-1-4244-4412-0 figure 4.

\* cited by examiner

COMMON-GATE COMMON-SOURCE AMPLIFIER

BACKGROUND

1. Field

The disclosure relates to integrated circuit (IC) design, and more particularly, to techniques for designing a common-gate common-source amplifier.

2. Background

In transistor amplifier design, two commonly used circuit topologies are the common-gate amplifier and the common-source amplifier. Common-gate and common-source amplifiers may be used in the design of, e.g., low-noise amplifiers (LNA's) for radio-frequency integrated circuits (RFIC's). In a typical LNA design, a common-source amplifier may provide the advantage of good noise performance, but with the drawback of narrow input matching range. A common-gate amplifier, on the other hand, may provide the advantage of robust input matching, but with higher noise figure (NF).

Prior art techniques exist for unifying both the common-gate and common-source topologies in a single amplifier design. See, e.g., Blaakmeer, et al., "Wideband Balun-LNA With Simultaneous Output Balancing, Noise-Canceling and Distortion-Canceling," IEEE Journal of Solid-State Circuits, Vol. 43, No. 6, June 2008, pp 1341-1350. It would be desirable to improve the performance of such unified common-gate common-source amplifiers, e.g., to decrease the noise figure of such amplifiers beyond what is available from the prior art.

DETAILED DESCRIPTION

The detailed description set forth below in connection with the appended drawings is intended as a description of exemplary embodiments of the present invention and is not intended to represent the only exemplary embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Figure 1:
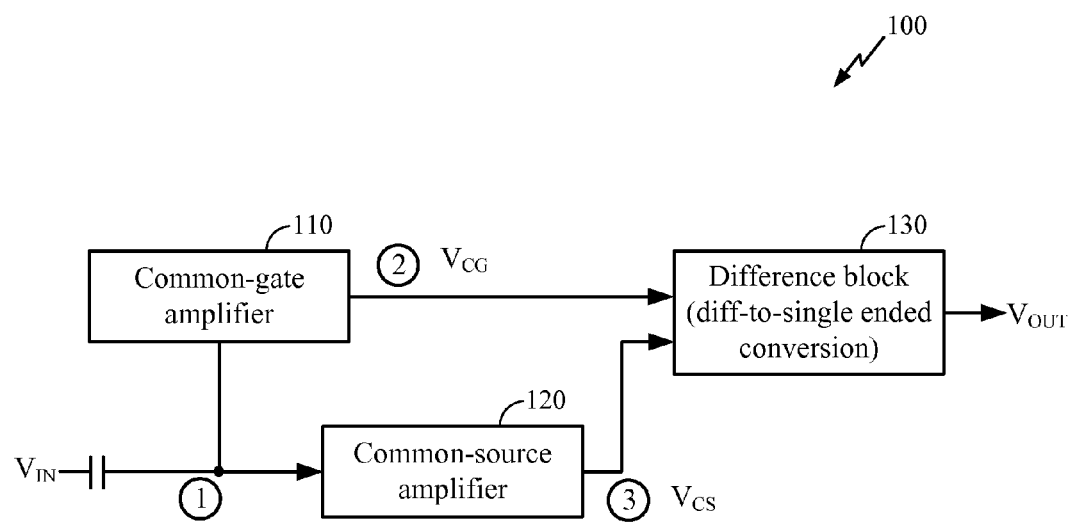
FIG. 1 illustrates an exemplary embodiment of a common-gate common-source amplifier according to the present disclosure.

FIG. 1 illustrates an exemplary embodiment of a common-gate common-source amplifier 100 according to the present disclosure. In FIG. 1, an input voltage $V_{IN}$ is AC-coupled to a node 1 (wherein a labeled node is depicted as a corresponding circled number in the accompanying figures). Node 1 is coupled to the inputs of both a common-gate amplifier 110 and a common-source amplifier 120. The common-gate amplifier 110 generates a common-gate output voltage $V_{CG}$ at node 2, and the common-source amplifier 120 generates a common-source output voltage $V_{CS}$ at node 3. $V_{CG}$ and $V_{CS}$ are coupled to the input of a difference block 130, which converts the voltage difference between $V_{CG}$ and $V_{CS}$ into a single-ended output voltage $V_{OUT}$.

Figure 2:
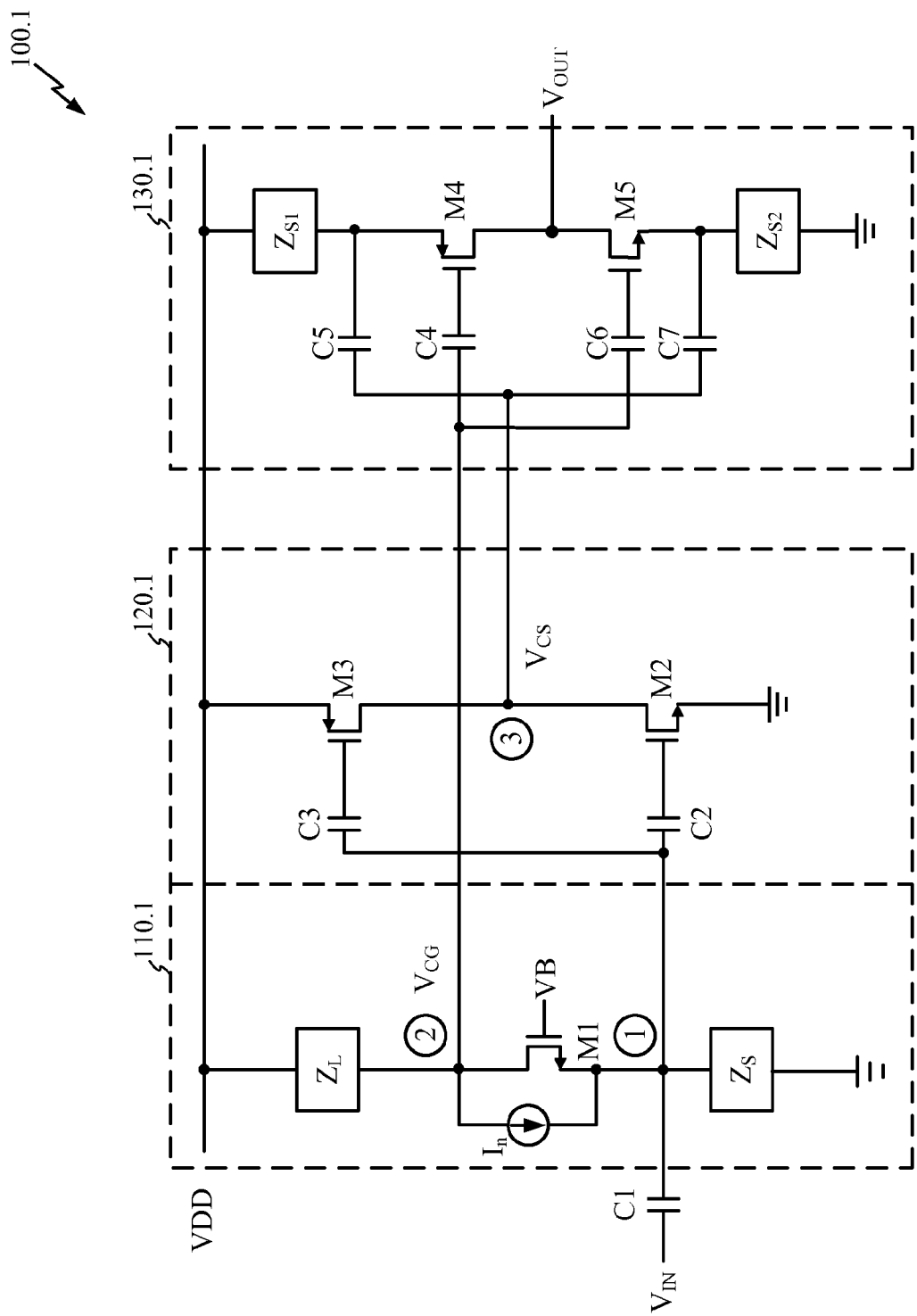
FIG. 2 illustrates an exemplary embodiment of the amplifier shown in FIG. 1.

FIG. 2 illustrates an exemplary embodiment 100.1 of the amplifier 100 shown in FIG. 1. In FIG. 2, the input voltage $V_{IN}$ is AC-coupled via coupling capacitor C1 to node 1. Node 1 is simultaneously coupled to the input of an exemplary instance 110.1 of a common-gate amplifier 110, and to the input of an exemplary instance 120.1 of a common-source amplifier 120.

The common-gate amplifier 110.1 includes a transistor M1 biased by a voltage VB. The source of M1 is coupled to node 1, and further to a source impedance $Z_S$. The drain of M1 is coupled to node 2, and further to a load impedance $Z_L$. A current source $I_n$ is shown coupled between the drain and source of transistor M1. In an exemplary embodiment, the current source $I_n$ may represent a channel current noise contribution from transistor M1. Common-gate amplifier 110.1 generates a common-gate output voltage $V_{CG}$ at node 2 related to the common-gate input voltage at node 1, which is derived from the amplifier input voltage $V_{IN}$.

One of ordinary skill in the art will appreciate that in exemplary embodiments of a common-gate amplifier, the source impedance $Z_s$ may include a resistance, or inductance, or current source output, etc. Furthermore, the load impedance $Z_L$ may include an inductance, or resistance, or any other load element. Such exemplary embodiments are contemplated to be within the scope of the present disclosure.

As further shown in FIG. 2, the common-source amplifier 120.1 includes complementary transistors M2 and M3. Note that in this specification and in the claims, the term "complementary" may refer to the relationship between "P-type" and "N-type" transistors. For example, the complementary transistor to an NMOS transistor may be a PMOS transistor, and vice versa.

In the common-source amplifier 120.1, the signal voltage at node 1 is AC-coupled to the gates of M2 and M3 via coupling capacitors C2 and C3, respectively. Common-source amplifier 120.1 generates a common-source output voltage $V_{CS}$ at node 3 related to the common-source input voltage at node 1.

Note the DC biasing of M2 and M3 is not explicitly shown in FIG. 1, but may be readily derived by one of ordinary skill in the art.

One of ordinary skill in the art will appreciate that in alternative exemplary embodiments of the present disclosure, a common-source amplifier may have a different configuration from that shown in FIG. 2. For example, either one of the complementary transistors M2 and M3 in common-source amplifier 120.1 may be omitted and replaced by, e.g., a passive load such as a resistance or inductance. Furthermore, source degeneration (not shown) may be incorporated in a common-source amplifier. In alternative exemplary embodiments (not shown), the output of the common-source amplifier may be further coupled to a cascoded transistor to, e.g., buffer the output of the common-source amplifier. Such alternative exemplary embodiments are contemplated to be within the scope of the present disclosure.

Figure 2A:
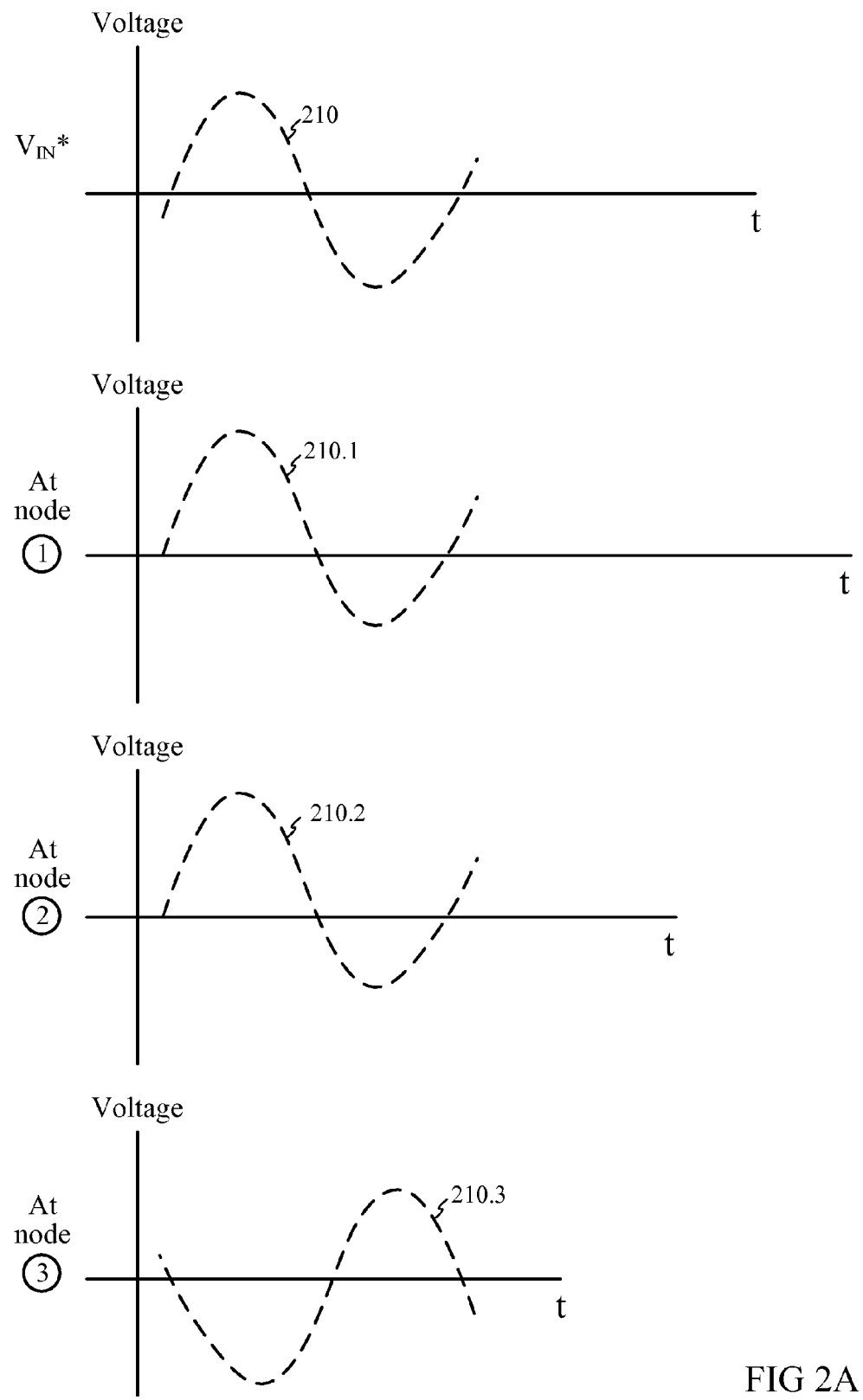
FIGS. 2A and 2B illustrate signal currents and voltages present during operation of the common-gate common-source amplifier.
Figure 2B:
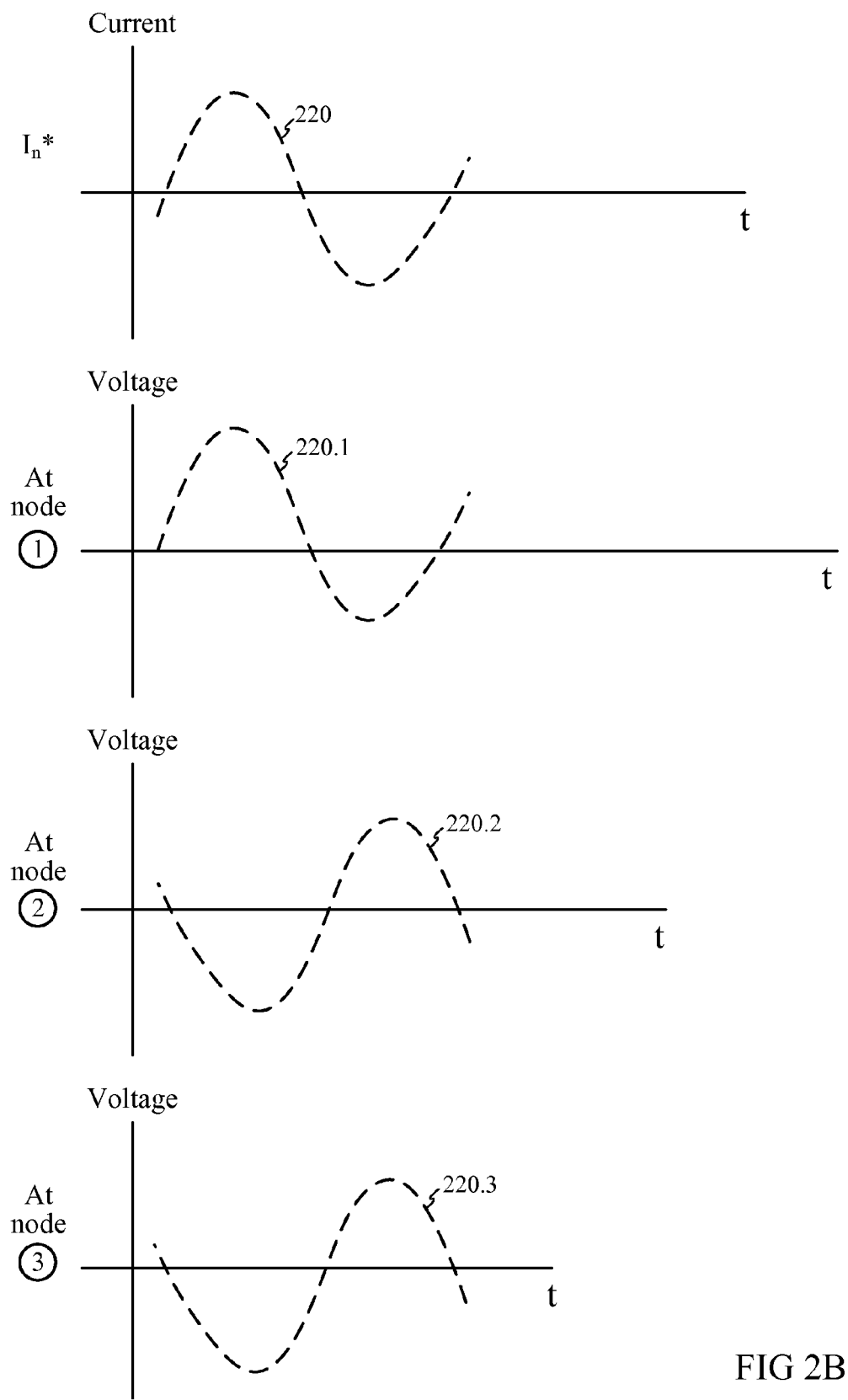

FIGS. 2A and 2B illustrate signal currents and voltages present during operation of a common-gate common-source amplifier such as 100.1. Note the signals in FIGS. 2A and 2B are shown for illustrative purposes only, and are not meant to limit the scope of the present disclosure to any particular signal waveforms depicted.

In FIG. 2A, an illustrative instance $V_{IN}^*$ of the input voltage $V_{IN}$ is shown as signal 210, plotted versus time (t).

The voltage perturbation at node 1 due to signal 210 is shown as signal 210.1. Signal 210.1 has the same polarity as signal 210, as the voltage at node 1 is directly AC-coupled to the input voltage $V_{IN}$ via the coupling capacitor C1, as shown in FIG. 2.

The voltage perturbation at node 2 due to signal 210.1 is shown as signal 210.2. Signal 210.2 has the same polarity as signal 210.1. This is because the common-gate amplifier 110.1 is a non-inverting amplifier, and thus the voltage at the common-gate input node 1 has the same polarity as the voltage at the common-gate output node 2.

The voltage perturbation at node 3 due to signal 210.1 is shown as signal 210.3. The signal 210.3 has an opposite polarity from signal 210.1. This is because the common-source amplifier 120.1 is an inverting amplifier, and thus the voltage at the common-source input node 1 has an opposite polarity from the voltage at the common-source output node 3.

As seen from FIG. 2A, the voltage perturbations at node 2 and node 3 due to signal 210 have opposite polarities from each other.

Reference is now made to FIG. 2B, showing an illustrative instance $I_n^*$ of the current from current source $I_n$ as signal 220.

The voltage perturbation at node 1 due to signal 220 is shown as signal 220.1. Signal 220.1 has the same polarity as signal 220, as the current from $I_n$ flows to ground via source impedance $Z_S$.

The voltage perturbation at node 2 due to signal 220 is shown as signal 220.2. Signal 220.2 has an opposite polarity from signal 220, as the current from $I_n$ is sourced from VDD via load impedance $Z_L$.

The voltage perturbation at node 3 due to signal 220 is shown as signal 220.3. Signal 220.3 has an opposite polarity from signal 220.1, as the common-source amplifier 120.1 is an inverting amplifier, and thus the voltage at the common-source input node 1 has an opposite polarity from the voltage at the common-source output node 3.

As seen from FIG. 2B, the voltage perturbations at node 2 and node 3 due to signal 220 have the same polarity.

Based on the preceding description, it will be appreciated that by appropriately generating a difference between the voltage $V_{CG}$ at node 2 and the voltage $V_{CS}$ at node 3, the voltage perturbations due to the signal input voltage $V_{IN}$ may be reinforced, while the voltage perturbations due to the noise current source $I_n$ may be cancelled.

Referring again to FIG. 2, an exemplary instance 130.1 of a difference block 130 is shown for generating a single-ended output voltage $V_{OUT}$ that is proportional to the difference between the voltages $V_{CG}$ and $V_{CS}$. The difference block 130.1 includes an NMOS transistor M5 coupled to a PMOS transistor M4, along with source impedances $Z_{S1}$ and $Z_{S2}$. Note the DC biasing details of M4 and M5 are not explicitly shown, but may be readily derived by one of ordinary skill in the art.

In difference block 130.1, $V_{CG}$ at node 2 is AC-coupled via coupling capacitor C6 to the gate of NMOS transistor M5, while $V_{CS}$ at node 3 is AC-coupled via coupling capacitor C7 to the source of M5. In accordance with MOS transistor operation, M5 generates a drain current $I_{DS}$ (not labeled in FIG. 2) that is proportional to the gate-to-source voltage ($V_{GS}$) of M5. Accordingly, $I_{DS}$, along with the output voltage $V_{OUT}$, is proportional to the voltage difference between $V_{CG}$ and $V_{CS}$.

In the exemplary embodiment 130.1 of the difference block shown, a PMOS transistor M4 is also provided, coupled in series between the supply voltage VDD and the drain of transistor M5. M4 functions in a manner similar to that described for M5, with the voltage $V_{CG}$ being AC-coupled via coupling capacitor C4 to the gate of M4, and the voltage $V_{CS}$ being AC-coupled via coupling capacitor C5 to the source of M4. The provision of PMOS transistor M4 further reinforces the drain current $I_{DS}$ and the output voltage $V_{OUT}$ as being proportional to the difference between $V_{CG}$ and $V_{CS}$.

It will be appreciated that providing both a PMOS transistor M4 and an NMOS transistor M5 in the difference block 130.1 advantageously improves the gain of the difference block 130.1, and thus the gain of the amplifier 100.1, beyond what may be possible from providing only a single one of the transistors. Furthermore, both transistors M4 and M5 may share the same DC bias current, thus minimizing additional current consumption by the difference block 130. One of ordinary skill in the art will appreciate, however, that in alternative exemplary embodiments (not shown), either one of the transistors M4 or M5 may be omitted. Such alternative exemplary embodiments are contemplated to be within the scope of the present disclosure.

In an alternative exemplary embodiment (not shown), the coupling of $V_{CG}$ and $V_{CS}$ to the transistors M4 and/or M5 may be reversed, e.g., $V_{CG}$ may be coupled to the sources of M4 and M5, and $V_{CS}$ may be coupled to the gates of M4 and M5, to generate a drain current $I_{DS}$ proportional to the difference between $V_{CG}$ and $V_{CS}$. Such alternative exemplary embodiments are contemplated to be within the scope of the present disclosure.

Figure 3:
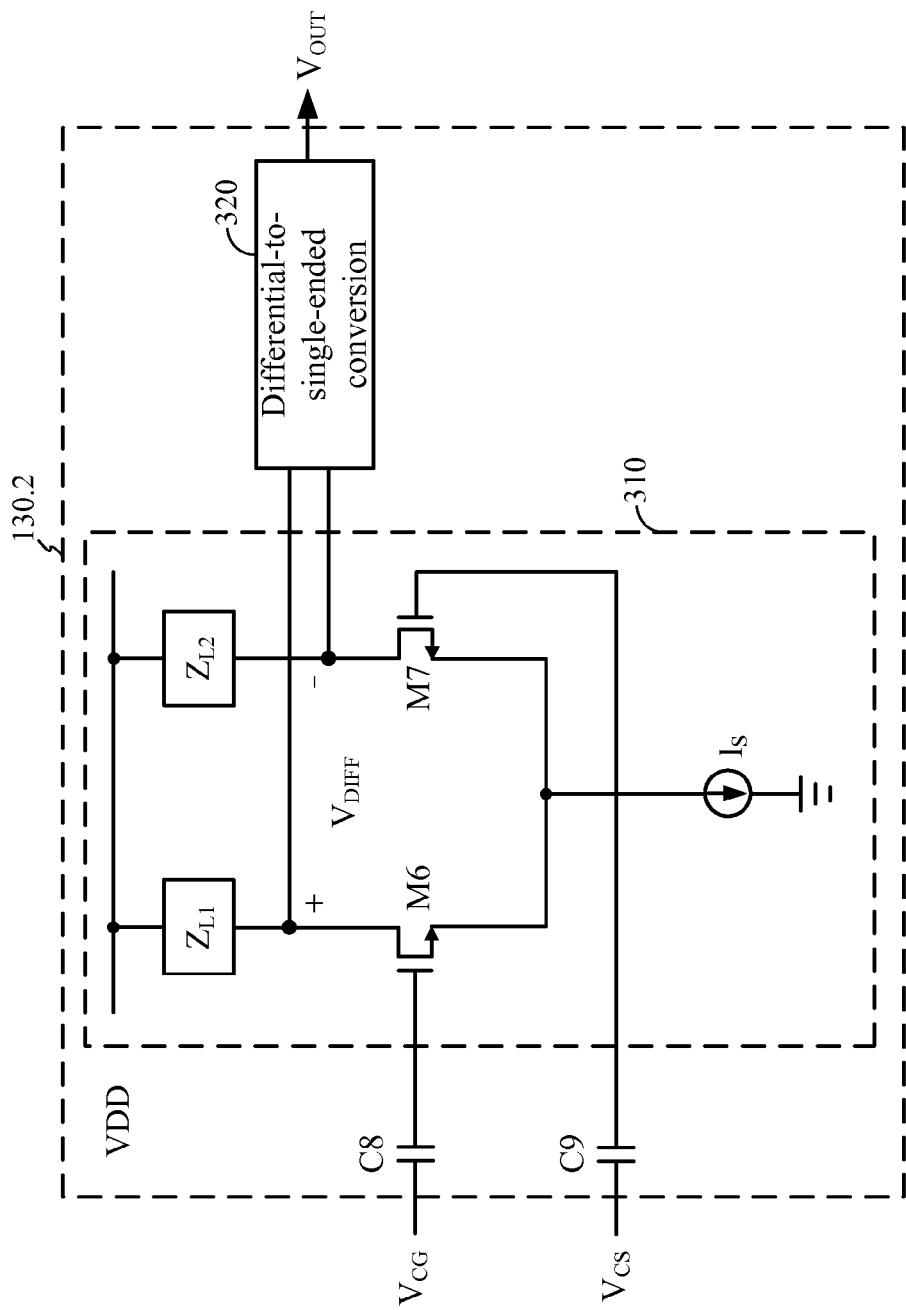
FIG. 3 illustrates an alternative exemplary embodiment of a difference block according to the present disclosure.

FIG. 3 illustrates an alternative exemplary embodiment 130.2 of a difference block 130 according to the present disclosure.

In FIG. 3, a difference amplifier 310 is shown that includes a differential transistor pair M6 and M7. The gates of M6 and M7 are AC-coupled via coupling capacitors C8 and C9 to the voltages $V_{CG}$ and $V_{CS}$ from nodes 2 and 3, respectively, of the common-gate common-source amplifier 100. Load impedances $Z_{L1}$ and $Z_{L2}$ are coupled to the drains of the transistor pair. One of ordinary skill in the art will appreciate that differences between the voltages $V_{CG}$ and $V_{CS}$ will cause the current from the tail current source $I_S$ to be steered towards one of the two branches of the differential pair, thus generating a corresponding differential voltage $V_{DIFF}$ at the drains of the transistor pair. The differential voltage $V_{DIFF}$ is coupled to a differential-to-single-ended conversion block 320 to generate a single-ended voltage $V_{OUT}$. In exemplary embodiments (not shown), any circuit architecture for differential-to-single-ended conversion known in the art may be employed for the differential-to-single-ended conversion block 320.

Figure 4:
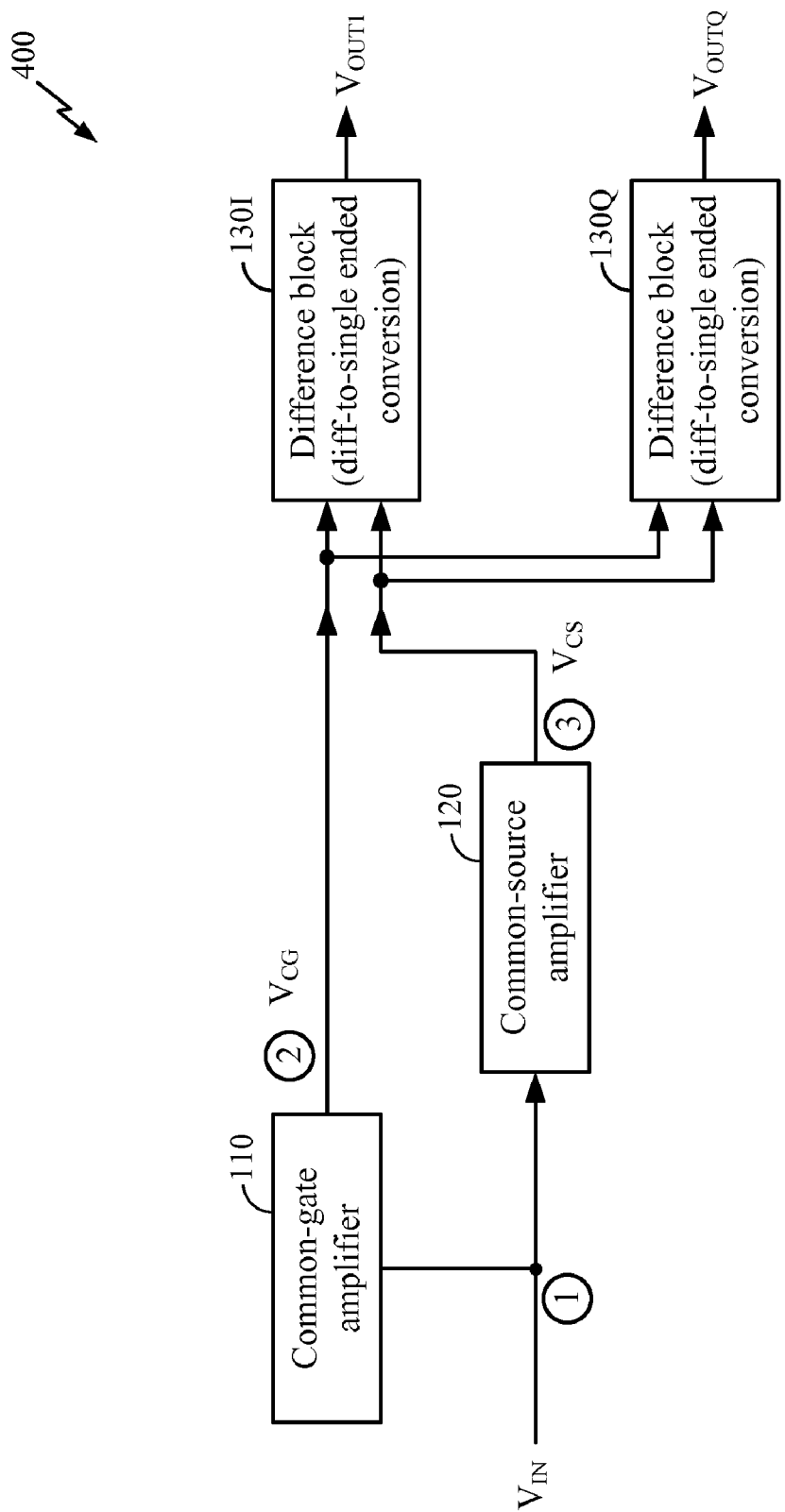
FIG. 4 illustrates an exemplary embodiment of the present disclosure wherein multiple instances of the difference block are coupled to the voltages $V_{CG}$ and $V_{CS}$.

FIG. 4 illustrates an exemplary embodiment 400 of the present disclosure wherein multiple instances 130I and 130Q of the difference block 130 are coupled to the voltages $V_{CG}$ and $V_{CS}$. Difference blocks 130I and 130Q advantageously generate duplicate output voltages $V_{OUTI}$ and $V_{OUTQ}$, respectively, which may be supplied to, e.g., quadrature (e.g., I and Q) down-conversion mixers (not shown) in a communications receiver exemplary embodiment of the present disclosure. The difference blocks 130I and 130Q may thus also function as buffers to isolate the output of an LNA exemplary embodiment of the present disclosure from the rest of the receive circuitry.

Figure 5:
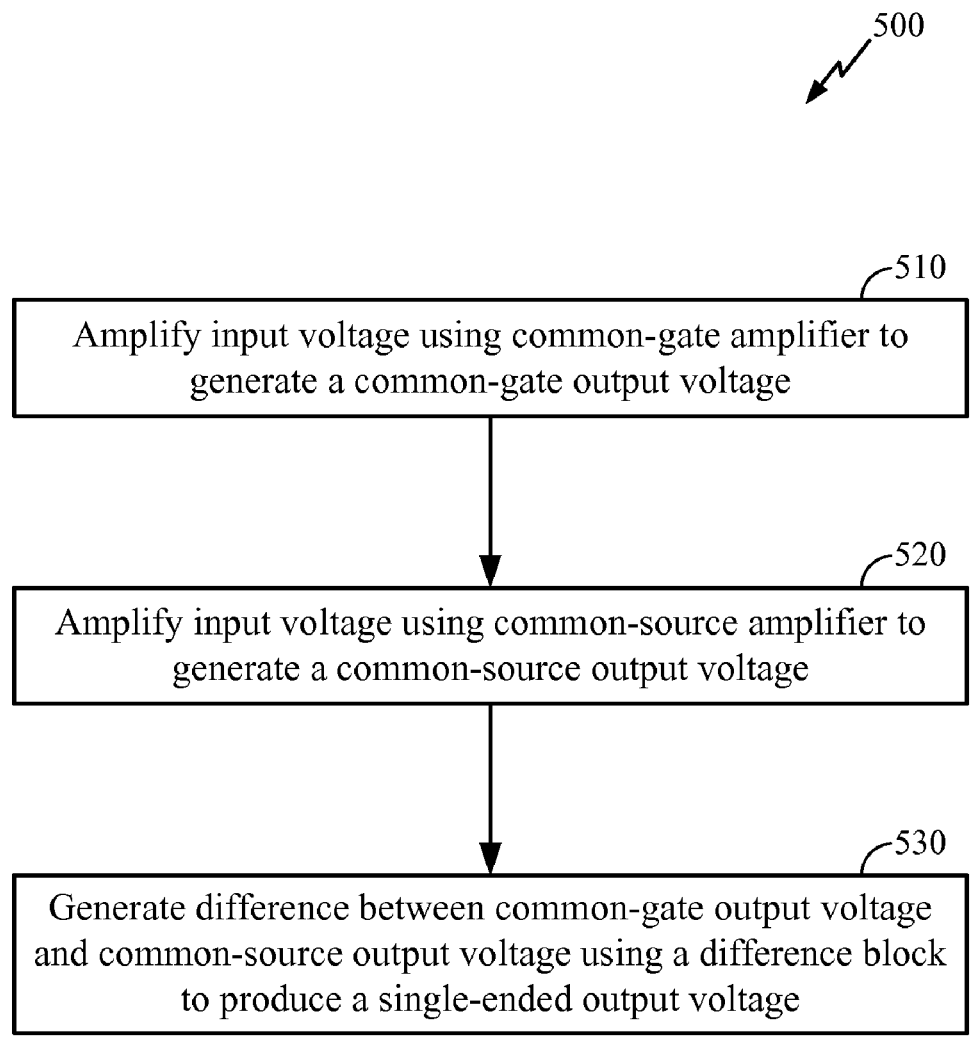
FIG. 5 illustrates an exemplary embodiment of a method according to the present disclosure.

FIG. 5 illustrates an exemplary embodiment of a method 500 according to the present disclosure. Note the method shown in FIG. 5 is given for illustrative purposes only, and is not meant to limit the scope of the present disclosure to any particular method shown.

In FIG. 5, at block 510, an input voltage is amplified using a common-gate amplifier to generate a common-gate output voltage. In an exemplary embodiment, the input voltage may be the voltage $V_{IN}$, the common-gate amplifier may be the exemplary common-gate amplifier 110.1, and the common-gate output voltage may be $V_{CG}$ as shown in FIG. 2.

At block 520, an input voltage is amplified using a common-source amplifier to generate a common-source output voltage. In an exemplary embodiment, the input voltage may be the voltage $V_{IN}$, the common-source amplifier may be the exemplary common-source amplifier 120.1, and the common-source output voltage may be $V_{CS}$ as shown in FIG. 2.

At block 530, a difference between the common-gate output voltage and the common-source output voltage may be generated using a difference block to produce a single-ended output voltage. In an exemplary embodiment, the difference block may be the difference block 130.1 or 130.2, and the single-ended output voltage may be $V_{OUT}$ as shown in FIG. 2.

Figure 6:
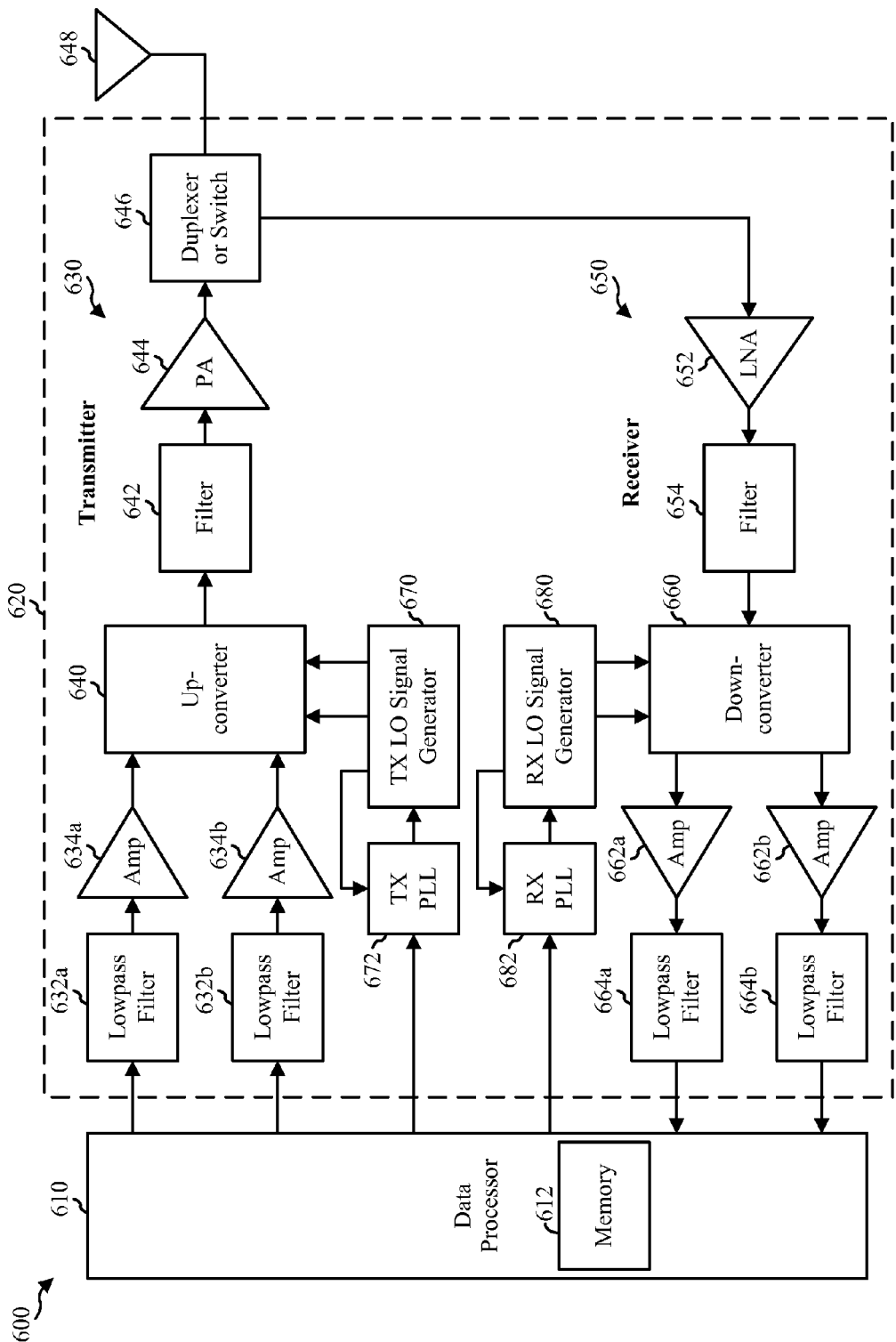
FIG. 6 illustrates a block diagram of a design of a wireless communication device in which the techniques of the present disclosure may be implemented.

FIG. 6 illustrates a block diagram of a design of a wireless communication device 600 in which the techniques of the present disclosure may be implemented. In the design shown in FIG. 6, wireless device 600 includes a transceiver 620 and a data processor 610 having a memory 612 to store data and program codes. Transceiver 620 includes a transmitter 630 and a receiver 650 that support bi-directional communication. In general, wireless device 600 may include any number of transmitters and any number of receivers for any number of communication systems and frequency bands.

A transmitter or a receiver may be implemented with a super-heterodyne architecture or a direct-conversion architecture. In the super-heterodyne architecture, a signal is frequency converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the design shown in FIG. 6, transmitter 630 and receiver 650 are implemented with the direct-conversion architecture.

In the transmit path, data processor 610 processes data to be transmitted and provides I and Q analog output signals to transmitter 630. Within transmitter 630, lowpass filters 632*a* and 632*b* filter the I and Q analog output signals, respectively, to remove undesired images caused by the prior digital-to-analog conversion. Amplifiers (Amp) 634*a* and 634*b* amplify the signals from lowpass filters 632*a* and 632*b*, respectively, and provide I and Q baseband signals. An upconverter 640 upconverts the I and Q baseband signals with I and Q transmit (TX) local oscillating (LO) signals from a TX LO signal generator 670 and provides an upconverted signal. A filter 642 filters the upconverted signal to remove undesired images caused by the frequency upconversion as well as noise in a receive frequency band. A power amplifier (PA) 644 amplifies the signal from filter 642 to obtain the desired output power level and provides a transmit RF signal. The transmit RF signal is routed through a duplexer or switch 646 and transmitted via an antenna 648.

In the receive path, antenna 648 receives signals transmitted by base stations and provides a received RF signal, which is routed through duplexer or switch 646 and provided to a low noise amplifier (LNA) 652. The received RF signal is amplified by LNA 652 and filtered by a filter 654 to obtain a desirable RF input signal. A downconverter 660 downconverts the RF input signal with I and Q receive (RX) LO signals from an RX LO signal generator 680 and provides I and Q baseband signals. The I and Q baseband signals are amplified by amplifiers 662*a* and 662*b* and further filtered by lowpass filters 664*a* and 664*b* to obtain I and Q analog input signals, which are provided to data processor 610.

In an exemplary embodiment, the techniques of the present disclosure may be readily applied to the design of, e.g., the LNA 652 in the wireless communication device 600. For example, the circuitry 400 shown in FIG. 4 may be utilized to generate duplicate versions of the received RF signal for processing by the quadrature downconversion branches of the receiver shown, while the LNA 652 itself may adopt the common-gate common-source techniques described herein with reference to FIG. 2. Such exemplary embodiments are contemplated to be within the scope of the present disclosure.

TX LO signal generator 670 generates the I and Q TX LO signals used for frequency upconversion. RX LO signal generator 680 generates the I and Q RX LO signals used for frequency downconversion. Each LO signal is a periodic signal with a particular fundamental frequency. A PLL 672 receives timing information from data processor 610 and generates a control signal used to adjust the frequency and/or phase of the TX LO signals from LO signal generator 670. Similarly, a PLL 682 receives timing information from data processor 610 and generates a control signal used to adjust the frequency and/or phase of the RX LO signals from LO signal generator 680.

FIG. 6 shows an example transceiver design. In general, the conditioning of the signals in a transmitter and a receiver may be performed by one or more stages of amplifier, filter, upconverter, downconverter, etc. These circuit blocks may be arranged differently from the configuration shown in FIG. 6. Furthermore, other circuit blocks not shown in FIG. 6 may also be used to condition the signals in the transmitter and receiver. Some circuit blocks in FIG. 6 may also be omitted. All or a portion of transceiver 620 may be implemented on one or more analog integrated circuits (IC's), RF ICs (RF-IC's), mixed-signal IC's, etc.

LO signal generators 670 and 680 may each include a frequency divider that receives a clock signal and provides a divider output signal. The clock signal may be generated by a voltage-controlled oscillator (VCO) or some other types of oscillator. The clock signal may also be referred to as a VCO signal, an oscillator signal, etc.

One of ordinary skill in the art will appreciate that while certain exemplary embodiments of the present disclosure have been shown utilizing, e.g., one or more NMOS or PMOS transistors to perform a given function, alternative exemplary embodiments utilizing complementary versions of those transistors may readily be derived in light of the principles disclosed in the present disclosure. For example, wherever an NMOS transistor is shown, a PMOS transistor may generally also be employed, and vice versa, with the appropriate modifications readily derivable by one of ordinary skill in the art. Such alternative exemplary embodiments are contemplated to be within the scope of the present disclosure.

One of ordinary skill in the art will also appreciate that while exemplary embodiments of the present disclosure have been described with reference to MOS transistors (i.e., MOSFET's), the techniques of the present disclosure need not be limited to MOSFET-based designs, but may be readily applied to alternative exemplary embodiments (not shown) employing bipolar junction transistors (or BJT's) and/or other three-terminal transconductance devices. For example, in an exemplary embodiment (not shown), any of the amplifiers described may utilize BJT's rather than MOSFET's, with the collectors, bases, and emitters of the BJT's coupled as shown for the drains, gates, and sources, respectively, of the MOSFET's shown. Furthermore, unless otherwise noted, in this specification and in the claims, the terms "drain," "gate," and "source" may encompass both the conventional meanings of those terms associated with MOSFET's, as well as the corresponding nodes of other three-terminal transconductance devices, such as BJT's, which correspondence will be evident to one of ordinary skill in the art of circuit design.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill in the art would further appreciate that the various illustrative logical blocks, modules, circuits, and algorithm steps described in connection with the exemplary embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the exemplary embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the exemplary embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other exemplary embodiments without departing from the spirit or scope of the invention. Thus, the present invention is not intended to be limited to the exemplary embodiments shown herein but is to be accorded the widest scope consistent with the principles and novel features disclosed herein.

The invention claimed is:

1. A method for amplifying an input voltage to produce a single-ended output voltage, the method comprising:
    amplifying the input voltage using a common-gate amplifier to generate a common-gate output voltage;
    amplifying the input voltage using a common-source amplifier to generate a common-source output voltage; and generating the difference between the common-gate output voltage and the common-source output voltage using a difference block to produce the single-ended output voltage.

2. The method of claim 1, the generating the difference comprising:
   coupling the common-gate output voltage to the gate of a first difference transistor; and
   coupling the common-source output voltage to the source of the first difference transistor;
   the single-ended output voltage being coupled to the drain of the first difference transistor.

3. The method of claim 2, the generating the difference further comprising:
   coupling a cascoded transistor to the common-source output voltage prior to the source of the first difference transistor.

4. The method of claim 2, the generating the difference further comprising:
   coupling the common-gate output voltage to the gate of a second difference transistor, the second difference transistor being complementary to the first difference transistor, the drain of the second difference transistor being coupled to the drain of the first difference transistor; and
   coupling the common-source output voltage to the source of the first difference transistor.

5. The method of claim 1, the generating the difference comprising:
   coupling the common-gate output voltage to the source of a first difference transistor; and
   coupling the common-source output voltage to the gate of the first difference transistor;
   the single-ended output voltage being coupled to the drain of the first difference transistor.

6. The method of claim 1, the generating the difference comprising:
   coupling the common-gate output voltage to the gate of a first difference transistor of a differential pair, the differential pair further comprising a second difference transistor having a source coupled to the source of the first difference transistor, the differential pair further comprising respective loads coupled to the drains of the first and second difference transistors, the differential pair further comprising a tail current source;
   coupling the common-source output voltage to the gate of the second difference transistor; and
   converting the differential voltage between the drains of the first and second difference transistors to the single-ended output voltage.

7. The method of claim 1, the amplifying the input voltage using a common-gate amplifier comprising coupling the input voltage to the source of a common-gate transistor, the source of the common-gate transistor further coupled to a source impedance, the drain of the common-gate transistor further coupled to a load impedance.

8. The method of claim 7, the load impedance comprising an inductor, the source impedance comprising an inductor.

9. The method of claim 1, the amplifying the input voltage using a common-source amplifier comprising:
   coupling the input voltage to the gate of a first common-source transistor, the drain of the first common-source transistor coupled to the drain of a second common-source transistor, the second common-source transistor being complementary to the first common-source transistor; and
   coupling the input voltage to the gate of the second common-source transistor.

10. The method of claim 1, the amplifying the input voltage using a common-source amplifier comprising buffering the output of the common-source amplifier using a cascoded transistor.

11. An apparatus for amplifying an input voltage to produce a single-ended output voltage, the apparatus comprising:
    a common-gate amplifier configured to amplify the input voltage to generate a common-gate output voltage;
    a common-source amplifier configured to amplify the input voltage to generate a common-source output voltage;
    a difference block configured to generate a difference between the common-gate output voltage and the common-source output voltage to produce the single-ended output voltage.

12. The apparatus of claim 11, the difference block comprising:
    a first difference transistor, the gate of the first difference transistor coupled to the common-gate output voltage, the source of the first difference transistor coupled to the common-source output voltage, the single-ended output voltage coupled to the drain of the first difference transistor.

13. The apparatus of claim 12, the difference block further comprising:
    a cascoded transistor coupled between the common-source output voltage and the source of the first difference transistor.

14. The apparatus of claim 12, the difference block further comprising:
    a second difference transistor complementary to the first difference transistor, the drain of the second difference transistor being coupled to the drain of the first difference transistor, the common-gate output voltage coupled to the gate of the second difference transistor, the common-source output voltage coupled to the source of the second difference transistor.

15. The apparatus of claim 11, the difference block comprising:
    a first difference transistor, the common-gate output voltage coupled to the source of the first difference transistor, the common-source output voltage coupled to the gate of the first difference transistor, the single-ended output voltage being coupled to the drain of the first difference transistor.

16. The apparatus of claim 11, the difference block comprising:
    a differential pair comprising a first difference transistor and a second difference transistor, the common-gate output voltage coupled to the gate of the first difference transistor, the common-source output voltage coupled to the gate of the second difference transistor, the differential pair further comprising respective loads coupled to the drains of the first and second difference transistors, the differential pair further comprising a tail current source; and
    a differential-to-single-ended converter configured to convert the differential voltage between the drains of the first and second difference transistors to the single-ended output voltage.

17. The apparatus of claim 11, the common-gate amplifier comprising a common-gate transistor, a source impedance, and a load impedance.

18. The apparatus of claim 17, the load impedance comprising an inductor, the source impedance comprising an inductor.

19. The apparatus of claim 11, the common-source amplifier comprising:
  a first common-source transistor, the gate of the first common-source transistor being coupled to the input voltage; and
  a second common-source transistor complementary to the first common-source transistor, the drain of the first common-source transistor coupled to the drain of the second common-source transistor, the gate of the second common-source transistor coupled to the input voltage.

20. The apparatus of claim 11, the common-source amplifier further comprising a cascoded transistor.

21. An apparatus for amplifying an input voltage to produce a single-ended output voltage, the apparatus comprising:
  means for amplifying the input voltage of a common gate amplifier to generate a common-gate output voltage;
  means for amplifying the input voltage of a common source amplifier to generate a common-source output voltage; and
  means for generating a difference between the common-gate output voltage and the common-source output voltage to produce the single-ended output voltage.

22. The apparatus of claim 21, the means for generating a difference comprising:
  a first difference transistor, the gate of the first difference transistor coupled to the common-gate output voltage, the source of the first difference transistor coupled to the common-source output voltage, the single-ended output voltage coupled to the drain of the first difference transistor.

23. A device for wireless communications, the device comprising a TX LO signal generator, at least one baseband TX amplifier, an upconverter coupled to the TX LO signal generator and the at least one baseband TX amplifier, a TX filter coupled to the output of the upconverter, a power amplifier (PA) coupled to the TX filter, an RX LO signal generator, an RX filter, a downconverter coupled to the RX LO signal generator and the RX filter, a low-noise amplifier (LNA) coupled to the RX filter, and a duplexer coupled to the PA and the LNA, the LNA amplifying an output voltage of the duplexer to produce a single-ended output voltage, the LNA comprising:
  a common-gate amplifier configured to amplify the output voltage of the duplexer to generate a common-gate output voltage;
  a common-source amplifier configured to amplify the output voltage of the duplexer to generate a common-source output voltage;
  a difference block configured to generate a difference between the common-gate output voltage and the common-source output voltage to produce the single-ended output voltage.

* * * * *